United States Patent
Blake et al.

(10) Patent No.: US 6,434,285 B1
(45) Date of Patent: Aug. 13, 2002

(54) FIBER OPTIC DIFFERENCE CURRENT SENSOR

(75) Inventors: James N. Blake; Glen A. Sanders, both of Scottsdale, AZ (US)

(73) Assignee: NxtPhase Technologies SRL, Phoenix, AZ (US)

( * ) Notice: Subject to any disclaimer, the term of this patent is extended or adjusted under 35 U.S.C. 154(b) by 0 days.

(21) Appl. No.: 09/224,370

(22) Filed: Dec. 31, 1998

(51) Int. Cl.[7] .......... G02B 6/00; G01R 33/02; G01R 31/00; G01R 15/24

(52) U.S. Cl. .......... 385/12; 324/96; 324/244.1; 250/225

(58) Field of Search .......... 385/12; 356/364, 356/345, 351, 368; 324/96, 244.1, 117 R, 126, 127; 250/225, 227.17, 227.24; 359/280–283

(56) References Cited

U.S. PATENT DOCUMENTS

| | | | |
|---|---|---|---|
| 4,947,107 A | * 8/1990 | Doerfler et al. | 324/96 |
| 5,134,362 A | * 7/1992 | Ochi | 324/96 |
| 5,463,313 A | * 10/1995 | Berkcan | 324/117 R |
| 5,644,397 A | 7/1997 | Blake | |
| 5,696,858 A | 12/1997 | Blake | |
| 5,963,026 A | * 10/1999 | Bosselmann et al. | 324/96 |

OTHER PUBLICATIONS

Patent Abstracts of Japan, vol. 011, No. 093, Mar. 24, 1987, Same as JP 61 246671 A, Showa Electric Wire & Cable, Nov. 1, 1986.

* cited by examiner

Primary Examiner—Frank G. Font
Assistant Examiner—Michael P. Mooney
(74) Attorney, Agent, or Firm—Robert A. Pajak

(57) ABSTRACT

A sensor that measures a difference of currents at two locations along a conductor. The sensor uses two fiber optic current sensors. One current sensor at the first location measures current and has a nulling coil about its sensing loop, which carries current to null out the reading of current. Another current sensor at the second location measures current and also has a nulling coil about its sensing loop. The nulling coil of the latter sensor has the same current as the nulling coil of the sensor at the first location. For similar current sensors sensing the same magnitudes of current at their respective locations will have their outputs nulled to zero. However, if the first sensor output is nulled out and the sensor at the second location is sensing a different amount of current than the sensor at the first location, with the same amount of current in its nulling coil, then the output of the second sensor will indicate the difference of currents at the two locations, thereby indicating a loss or a gain of current along the conductor.

25 Claims, 5 Drawing Sheets

FIBER OPTIC DIFFERENCE CURRENT SENSOR

BACKGROUND

The present invention pertains to fiber optic sensors and particularly to current sensors. More particularly, the invention pertains to current difference measuring.

It is often desirable to measure the difference between current flowing at two points along the same conductor. Such measurements are used for differential fault current relaying in electric power systems. In addition to detecting large faults, the difference current can also give information about the health and remaining life of the insulation surrounding the conductor. For example, small leakage currents to ground through the insulation cause the current at the two points to become unequal.

A difficulty arises when trying to measure small leakage currents to monitor the health and remaining life of the insulation. The difficulty is that important leakage currents may be a factor of one million lower than the main current flowing through the conductor. Thus, to just make a measurement at two points along the conductor and compare the results would require that the two current sensors be calibrated to within one part-per-million of each other. This requirement is excessively difficult to achieve.

A second issue is that the leakage current may be a higher harmonic of the main current flowing in the conductor. The leakage current may only exist when the voltage on the conductor exceeds some threshold; the insulator material may act as a non-linear impedance to ground. To accurately measure the harmonic current level in the two sensors in the presence of the main current requires that both current sensors exhibit extraordinary linear responses. For some applications, the harmonic distortion of the sensors needs to be less than one part-per-million. Again, this requirement is excessively difficult to meet.

Some of the elements of the present current sensor arrangement may utilize sensor technology from the art. Optical fiber current sensor technology is disclosed in U.S. Pat. No. 5,644,397 issued Jul. 1, 1997, to inventor James N. Blake, and entitled "Fiber Optic Interferometric Circuit and Magnetic Field Sensor", which is incorporated herein by reference. Similar technology is also disclosed in U.S. Pat. No. 5,696,858 issued Dec. 9, 1997, to inventor James N. Blake, and entitled, "Fiber Optics Apparatus and Method for Accurate Current Sensing", which is incorporated herein by reference.

SUMMARY OF THE INVENTION

The present invention utilizes first and second optical current sensors placed at two different points in an electrical system. In addition to the main conductor passing through the two current sensors, a common secondary nulling current is provided to pass through each current sensor as well. This nulling current is advantageously generated using a closed loop signal processor connected to the first current sensor. The nulling current then flows through the second current sensor, either by a direct wire connection, or by a wireless (e.g., RF or optical) or wire (e.g., telephone line) communications link which provides the necessary information for a secondary current generator to generate substantially the same nulling current as flows through the first current sensor. The nulling current causes the first sensor to register zero output and is therefore equal and opposite to the main current flowing through the first sensor. As this nulling current passes through the second sensor, the output of the second sensor is the difference between the main current flowing therethrough and the nulling current, or equivalently, the difference between the main currents flowing through the two sensors. Thus the output of the second sensor is substantially equal to the leakage current.

DESCRIPTION OF THE EMBODIMENT

Figure 1:
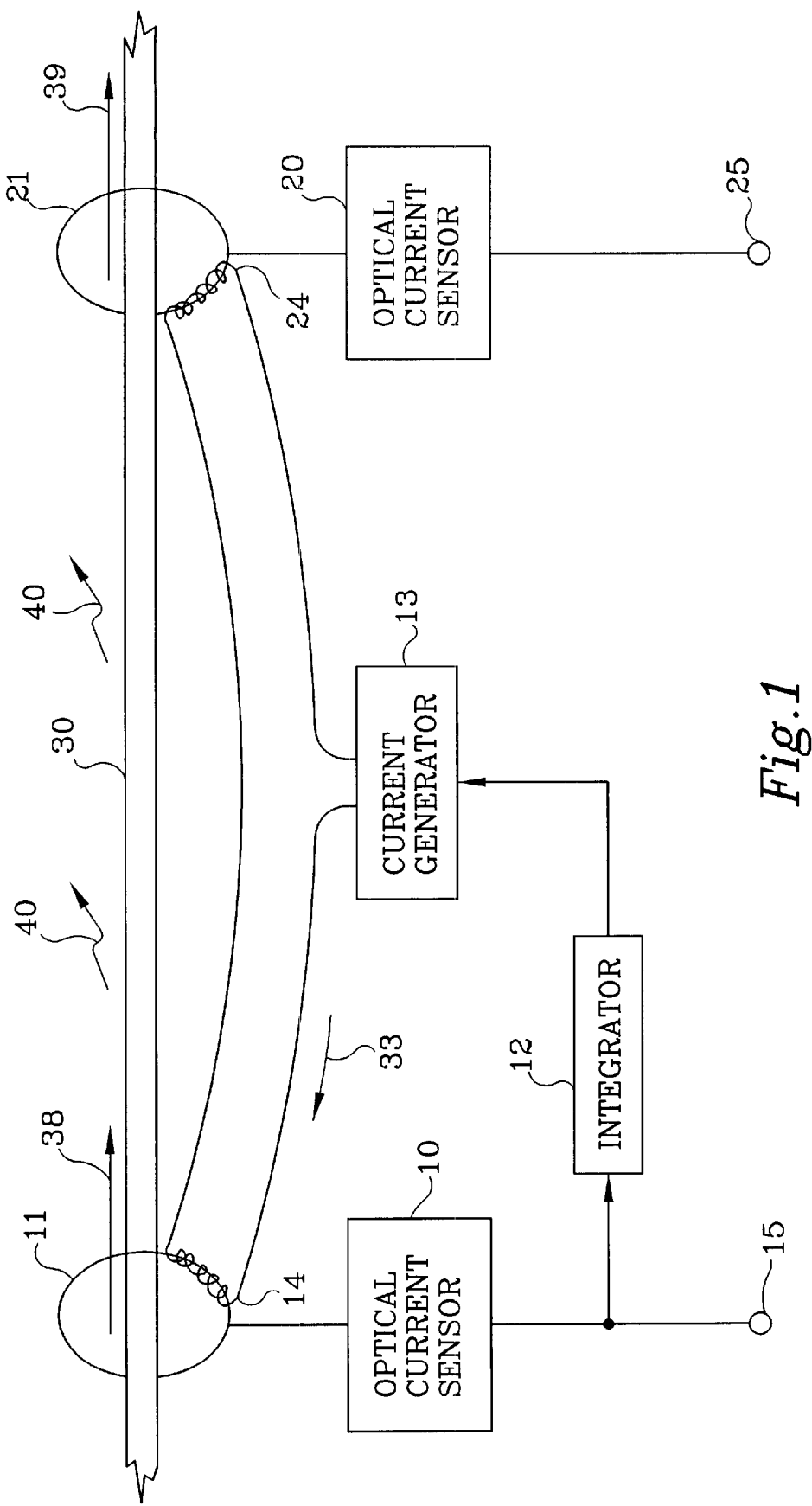
FIG. 1 shows a leakage current detector system using a closed current nulling loop.

FIG. 1 shows in block diagram form a leakage current detector system using a closed current nulling loop. Optical current sensor 10 measures a current 38 flowing through optical current sensor head 11. Likewise, optical current sensor 20 measures the current 39 flowing through optical current sensor head 21. Optical current sensor heads 11 and 21 are placed at different points along conductor 30. If there is no leakage current 40 leaving conductor 30 between optical current sensor heads 11 and 21, then the same current in conductor 30 passes through both optical current sensor heads 11 and 21. Any leakage current 40 in conductor 30 shows up as a difference current between optical sensor heads 11 and 21.

An output 15 of optical current sensor 10 is integrated by integrator 12 and fed to current generator 13. Current generator 13 provides current 33 to flow through current nulling loop 14. Current nulling loop 14 comprises one or more turns of wire wound around optical current sensor head 11. Integrator 12, current generator 13 and current nulling loop 14 collectively comprise a closed loop system to maintain the residual output 15 of optical current sensor 10 at a null.

Current 33 that current generator 13 provides to current nulling loop 14 is also made to pass through current nulling loop 24, which has the same number of turns of wire as nulling loop 14. If conductor 30 does not leak any current 40 between optical current sensor heads 11 and 21, then current 33 flowing through current nulling loop 24 has the same nulling efficiency at optical current sensor head 21 as current nulling loop 14 provides to optical current sensor head 11. Thus, residual output 25 is zero. If some leakage current 40 does pass out of conductor 30 between optical current sensor heads 11 and 21, then this leakage current 40 is indicated at residual output 25.

The sensitivity of this system to small leakage currents 40 is affected by the quality of optical current sensors heads 11 and 21. To obtain good sensitivity, optical current sensor heads 11 and 21 must both be well isolated from currents not passing through them, and must be equally sensitive to the current in conductor 30 and current nulling loops 14 and 24, respectively. These qualities can be well achieved by fiber optic current sensors that exhibit uniform sensitivity to magnetic fields all around the circumference of optical current sensor heads 11 and 21. Uniform circumferential sensitivity to magnetic fields guarantees perfect isolation to currents outside the sensing loop, and uniform sensitivity to currents cutting the sensing loop.

Figure 2:
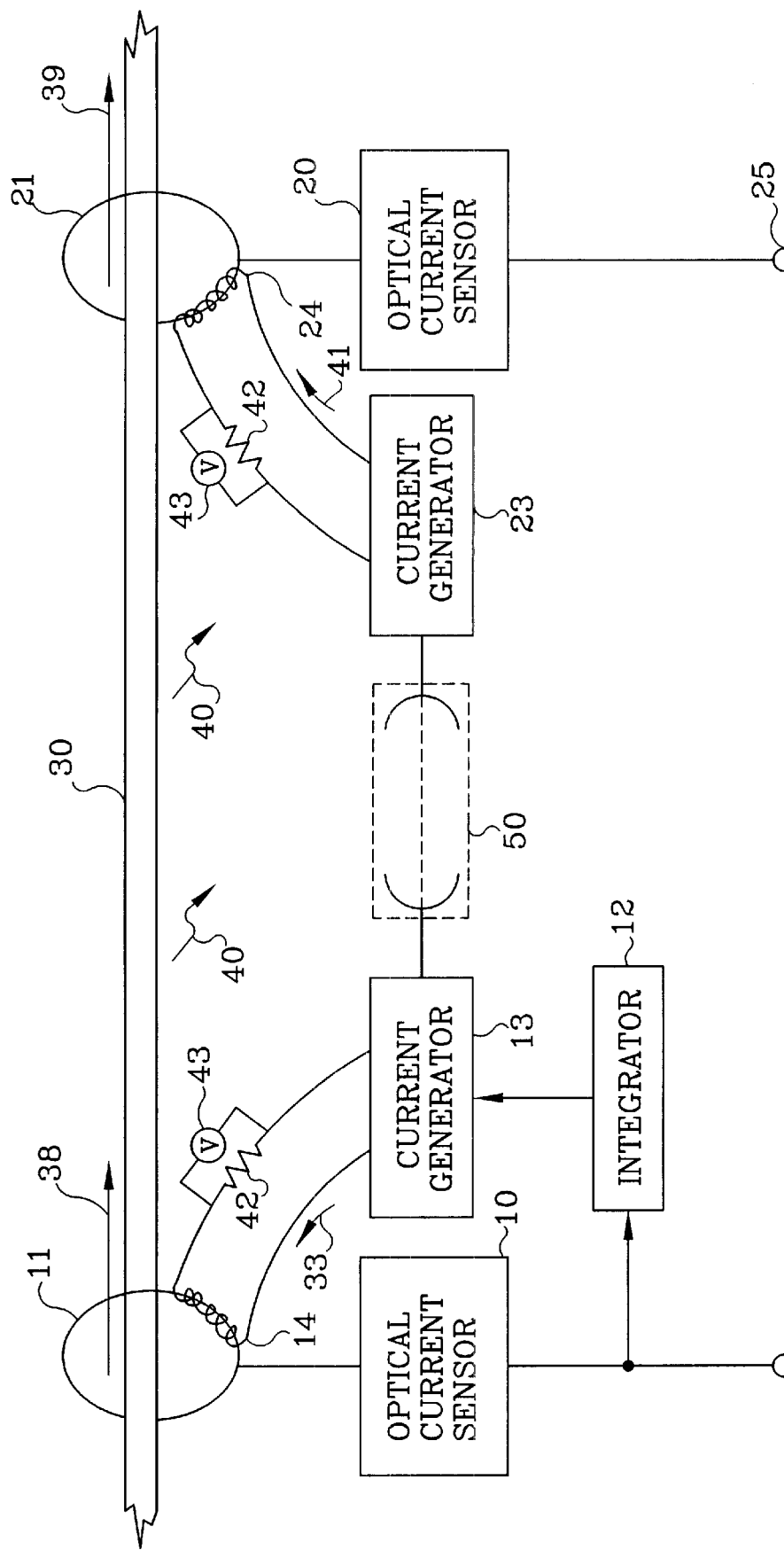
FIG. 2 shows a leakage current detector system using a communications link.

FIG. 2 shows in block diagram form a leakage current detector system using a pseudo-closed current nulling loop. Optical current sensor 10 measures the current 38 flowing through optical current sensor head 11. Likewise, optical current sensor 20 measures the current 39 flowing through optical current sensor head 21. Optical current sensor heads 11 and 21 are placed at different points along conductor 30. If there is no leakage current 40 leaving conductor 30 between optical current sensor heads 11 and 21, then the same current in conductor 30 passes through both optical current sensor heads 11 and 21. Any leakage current 40 in conductor 30 is revealed by a net current 39 flowing through optical sensor head 21.

Output 15 of optical current sensor 10 is integrated by integrator 12 and fed to current generator 13. Current generator 13 provides current 33 to flow through current nulling loop 14. Current nulling loop 14 comprises one or more turns of wire wound around optical current sensor head 11. Integrator 12, current generator 13 and current nulling loop 14 collectively comprise a closed loop system to maintain the residual output 15 of optical current sensor 10 at a null.

The amount of current 33 that current generator 13 provides to current nulling loop 14 is communicated via a wireless, wire or optical communications link 50 to current generator 23. In response, current generator 23 provides the same amount of current 41 to current nulling loop 24 as the amount of current 33 provided to current nulling loop 24. The similarity of magnitudes of currents 33 and 41 flowing in current nulling loops 14 and 24, is comparable to the similarity of magnitudes of the nulling currents in FIG. 1. Precision resistors 42 and voltmeters 43 can be used to measure nulling currents 33 and 41.

If conductor 30 does not leak any current 40 between optical current sensor heads 11 and 21, then current 41 flowing through current nulling loop 24 has the same nulling efficiency at optical current sensor head 21 as current nulling loop 14 provides to optical current sensor head 11. Therefore, residual output 25 is zero. If some leakage current 40 does pass out of conductor 30 between optical current sensor heads 11 and 21, then this amount leakage current is indicated at residual output 25.

Figure 3:
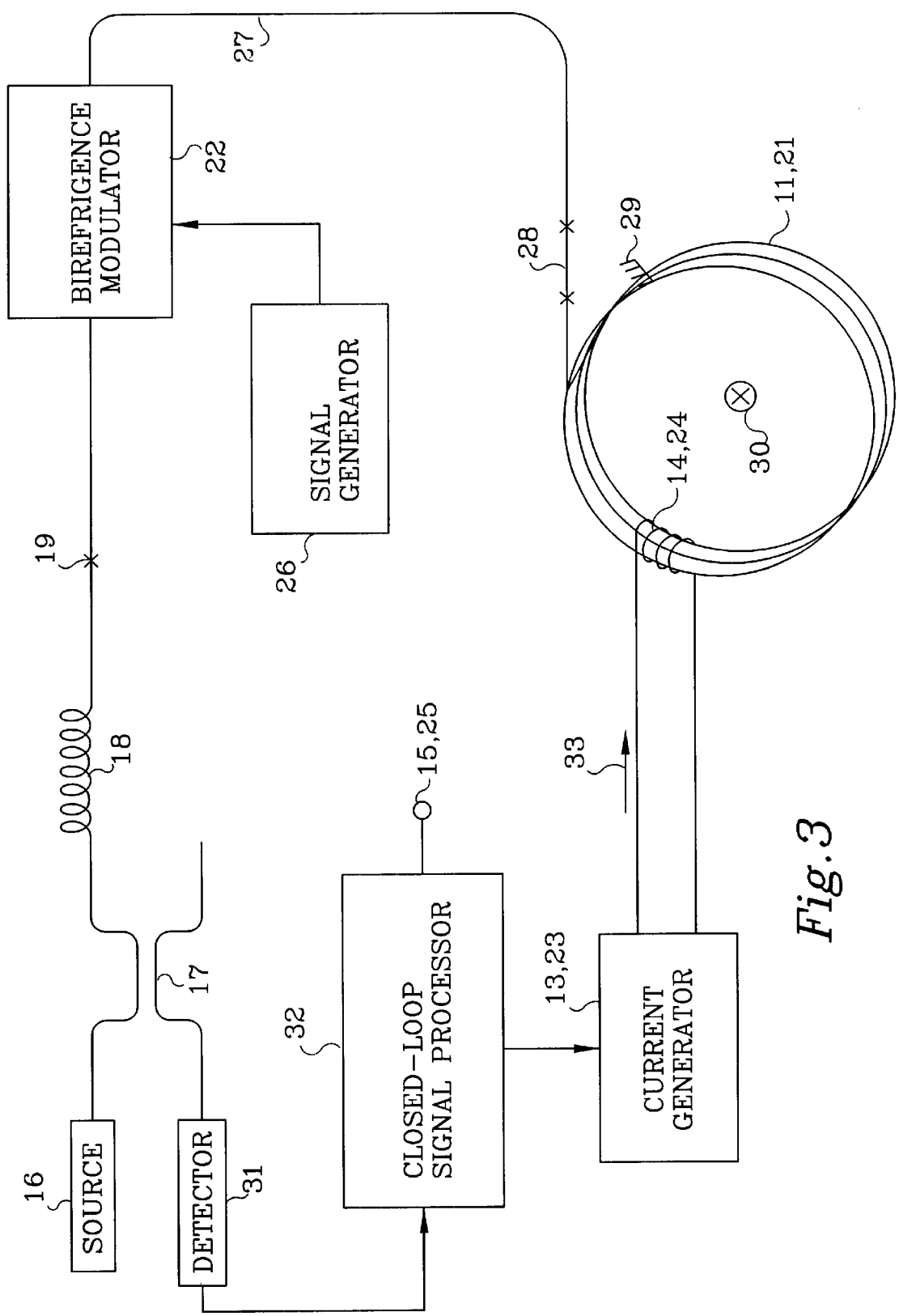
FIG. 3 shows an in-line current sensor utilizing a birefringence modulator and a phase nulling current based closed loop signal processing together with a sensing fiber.

FIG. 3 shows an in-line current sensor. Light from source 16 propagates through coupler 17 and polarizer 18 to a 45-degree splice 19, where it divides equally into the two polarization states maintained throughout the rest of the optical circuit. An electro-optic or piezoelectric birefringence modulator 22 differentially modulates the phases of the light in the two polarization states. Modulator 22 is driven by a modulator signal generator 26 that provides an electrical, periodic, alternating signal having either a square or sine wave. The light then propagates through delay line 27, through mode converter 28 which converts the two linear states of polarization into two circular states of polarization, and through sensor coil 11, 12. Sensor coil 11, 21 is wound around current carrying wire 30. The light reflects off reflective termination 29 and retraces its way through the optical circuit, finally arriving at detector 31.

A closed loop signal processor 32 drives a current generator 13, 23 that produces a phase nulling current 24. Phase nulling current 33 passes through sensor coil 11, 21 producing a substantially equal and opposite effect to that produced by the current in current carrying wire 30. With this method of operation, the non-reciprocal phase-shift induced in the current sensor is kept very small, allowing for a very high sensitivity sensing coil to be employed without encountering non-linearities associated with detecting large phase shifts.

Figure 4:
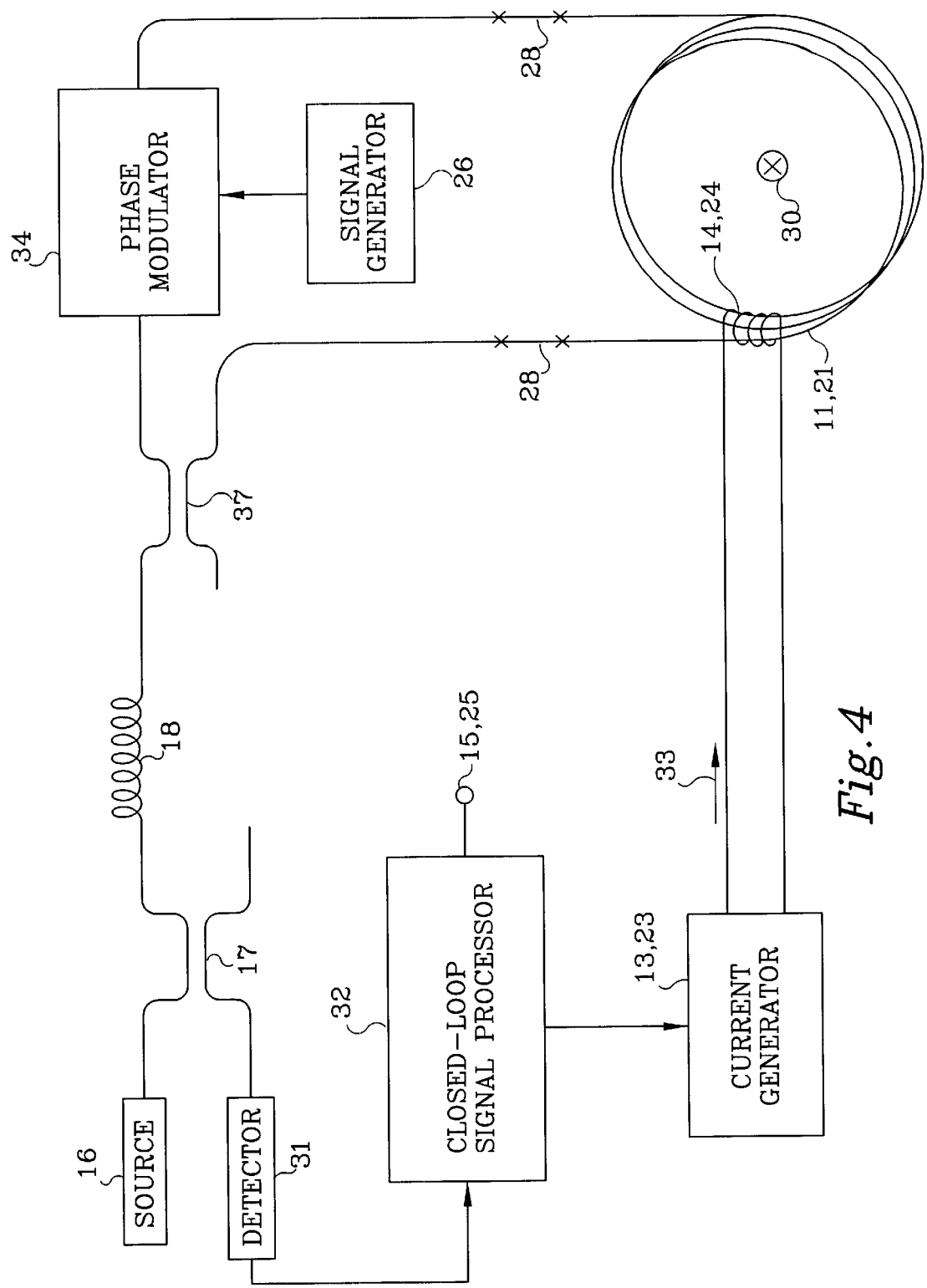
FIG. 4 shows a Sagnac type current sensor utilizing a phase modulator and a phase nulling current based closed loop signal processing together with a sensing fiber.

FIG. 4 shows a Sagnac loop current sensor. Light from source 16 propagates through coupler 17 and polarizer 18 to loop coupler 37 where it is split and sent in two directions around the fiber loop. An electro-optic or piezoelectric phase modulator 34 provides a dynamic phase bias. Modulators 22, 34 and 36 of FIGS. 3, 4 and 5, respectively, modulate the phase difference of the counter-propagating waves of a polarization state. The signal driving these modulators is a signal from a modulation signal generator 26. Generator 26 provides an electrical, periodic, alternating signal having either a square or sine wave. Mode converters 28 convert the light to a circular state of polarization for passage through sensor coil 11, 21. The signal processing is accomplished by closed loop signal processor 32 which drives a current generator 13, 23 which in turn produces phase nulling current 33. Phase nulling current 33 substantially cancels the non-reciprocal phase shift produced by the current in current carrying wire 30, allowing for a very high sensitivity sensing coil to be employed.

Figure 5:
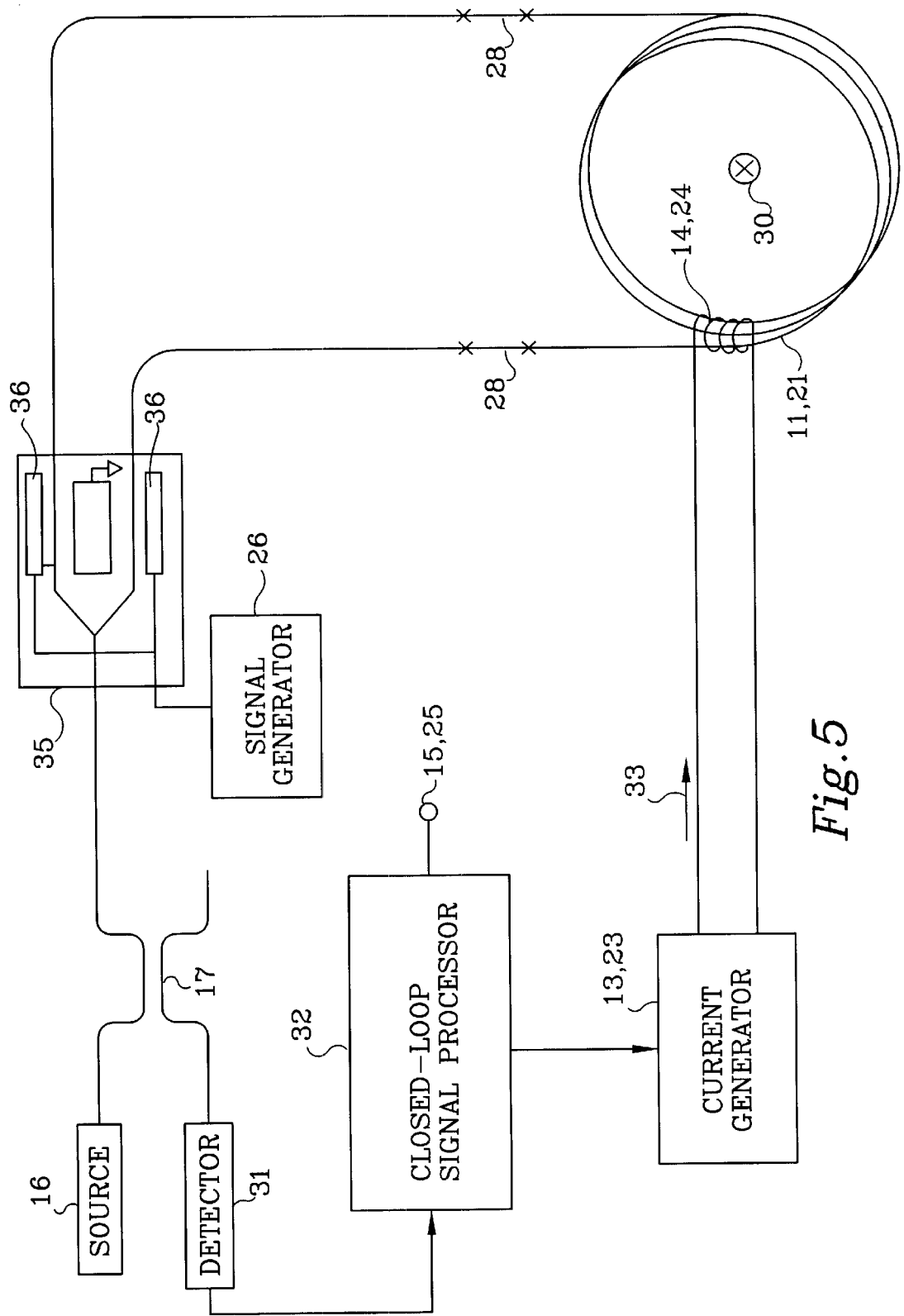
FIG. 5 shows a Sagnac type current sensor utilizing an electro-optic phase modulator and a phase nulling current based closed loop signal processing together with a sensing fiber.

FIG. 5 shows another version of the Sagnac loop current sensor where the polarization, loop splitter, and phase modulation functions have been combined into a single integrated optics multifunction chip 35. Signal processing is accomplished by closed loop signal processor 32, which drives current generator, 13, 23 which in turn provides phase nulling current 33.

The present invention encompasses various embodiments of the difference current sensor, which may have a variety of sensor elements such as in-line, Sagnac and polarimetric current sensors.

What is claimed is:

1. A system for measuring the difference in electrical current at first and second locations, comprising:
   means for optically sensing a first primary current at the first location;
   means for providing a first nulling current at the first location to null the first primary current;
   means for optically sensing a second primary current at the second location;
   means for providing a second nulling current at the second location to null the second primary current, wherein the second nulling current has substantially the same magnitude as the first nulling current; and
   means for optically sensing any un-nulled second primary current at the second location.

2. The system of claim 1, further comprising a means for providing the second nulling current that has substantially the same magnitude as the first nulling current.

3. The system of claim 2, wherein said means for providing the second nulling current that has substantially the same magnitude as the first nulling current, comprises a continuous current loop passing between the first and second locations.

4. The system of claim 2, wherein said means for providing the second nulling current that has substantially the same magnitude as the first nulling current, comprises a communications link and a current generator.

5. The system of claim 1, wherein said means for optically sensing first and second primary currents comprise fiber optic current sensors.

6. The system of claim 1, wherein said means for providing a first nulling current at the first location comprises an integrator, a current generator and a current nulling loop.

7. The system of claim 5, wherein said fiber optic current sensors comprise Sagnac loop type current sensors.

8. The system of claim 5, wherein said fiber optic current sensors comprise in-line type current sensors.

9. The system of claim 5, wherein said fiber optic current sensors comprise polarimetric-type current sensors.

10. A fiber optic difference current sensor for sensing loss of current as current successively passes through first and second locations on a conductor, comprising:
- a first fiber optic current sensor coupled to said conductor at said first location for sensing current passing through said conductor at said first location;
- a first nulling coil, coupled to said first fiber optic current sensor, for passing a first nulling current therethrough;
- a second fiber optic current sensor coupled to said conductor at said second location for sensing current passing through said conductor at said second location;
- a second nulling coil, coupled to said second fiber optic current sensor, for passing a second nulling current therethrough;
- first current generator means coupled to said first fiber optic current sensor for setting said first nulling current to a first current value such that said first fiber optic current sensor has substantially a null output value; and
- a second current generator means for setting said second nulling current to a second current value as a function of said first current value such that said second fiber optic current sensor has an output indicative of any loss of current occurring between said first and second locations.

11. The fiber optic difference current sensor of claim 10 wherein:
- said first and second nulling coils are substantially identical and connected in series, and
- said first and second current generators are provided by a single generator such that said first nulling current is said second nulling current.

12. The fiber optic difference current sensor of claim 10 wherein said second generator receives information indicative of said first nulling current through a communication link selected from the group consisting of a direct signal input from said first current generator, a wireless communication signal, and an optical signal.

13. The fiber optic difference current sensor of claim 12 wherein,
- said first and second nulling coils are substantially identical, and
- said second nulling current value is substantially equal to said first nulling current value.

14. A fiber optic difference current sensor for sensing loss of current as current successively passes through first and second locations on a conductor, comprising:
- a first fiber optic current sensor, including,
  - an optical sensing head through which said conductor passes therethrough at said first location, and
  - an output means for providing an output signal indicative of any current passing through any conductors passing through said sensing head;
- a first nulling coil, coupled to said optical sensing head of said first fiber optic current sensor, for passing a first nulling current therethrough;
- a second fiber optic current sensor, including,
  - an optical sensing head through which said conductor passes therethrough at said second location, and
  - an output means for providing an output signal indicative of any current passing through any conductors passing through said sensing head;
- a second nulling coil, coupled to said optical sensing head of said second fiber optic current sensor, for passing a second nulling current therethrough;
- first current generator means for setting said first nulling current to a first current value such that said first fiber optic current sensor has a null output value; and
- a second current generator means for setting said second nulling current to a second value as a function of said first current value.

15. The fiber optic difference current sensor of claim 14 wherein:
- said first and second nulling coils are substantially identical and connected in series, and
- said first and second current generators are provided by a single generator such that said first nulling current is said second nulling current.

16. The fiber optic difference current sensor of claim 14 wherein said second generator receives information indicative of said first nulling current through a communication link selected from the group consisting of a direct signal input from said first current generator, a wireless communication signal, and an optical signal.

17. The fiber optic difference current sensor of claim 16 wherein,
- said first and second nulling coils are substantially identical, and
- said second nulling current value is substantially equal to said first nulling current value.

18. A fiber optic difference current sensor for sensing loss of current as current successively passes through first and second locations on a conductor, comprising:
- a first fiber optic current sensor, including,
  - an optical sensing head through which said conductor passes therethrough at said first location, and
  - an output means for providing an output signal indicative of magnetic field coupled to said optical sensing head;
- a first nulling coil, coupled to said optical sensing head of said first fiber optic current sensor, for passing a first nulling current therethrough;
- a second fiber optic current sensor, including,
  - an optical sensing head through which said conductor passes therethrough at said second location, and
  - an output means for providing an output signal indicative of magnetic field coupled to said optical sensing head;
- a second nulling coil, coupled to said optical sensing head of said second fiber optic current sensor, for passing a second nulling current therethrough;
- first current generator means for setting said first nulling current to a first current value such that said first fiber optic current sensor has a null output value; and
- a second current generator means for setting said second nulling current to a second value as a function of said first current value.

19. The fiber optic difference current sensor of claim 18 wherein:
- said first and second nulling coils are substantially identical and connected in series, and
- said first and second current generators are provided by a single generator such that said first nulling current is said second nulling current.

20. The fiber optic difference current sensor of claim 18 wherein said second generator receives information indicative of said first nulling current through a communication link selected from the group consisting of a direct signal input from said first current generator, a wireless communication signal, and an optical signal.

21. The fiber optic difference current sensor of claim 20 wherein, said first and second nulling coils are substantially identical, and said second nulling current value is substantially equal to said first nulling current value.

22. A method of sensing loss of current as current successively passes through first and second locations on a conductor comprising the steps of:

sensing magnetic field coupled to a first optical current sensor sensing head through which said conductor passes therethrough at said first location, and providing a first output signal indicative thereof;

passing a first nulling current through a first nulling coil coupled to said first optical current sensor sensing head;

sensing magnetic field coupled to a second optical current sensor sensing head through which said conductor passes therethrough at said second location, and providing a second output signal indicative thereof;

passing a second nulling current through a second nulling coil coupled to said second optical current sensor sensing head;

generating said first nulling current at a first current value through said first nulling coil such that said first output signal is substantially a null output value; and generating said second nulling current at a second current value as a function of said first current value coil such that said second output signal is substantially representative of said current loss between said first and second conductor locations.

23. The method of claim 22 wherein:

said first and second nulling coils are substantially identical and connected in series, and said first and second nulling currents provided by a single generator such that said first nulling current is said second nulling current.

24. The method of claim 22 including the step of communicating said first nulling signal value generated by a first current generator to a second current generator to generate said second nulling current value through a communication link selected from the group consisting of a direct signal input where said first current generator is also said second current generator providing said first nulling current and said second nulling current, a wireless communication signal, and an optical signal.

25. The method of claim 22 wherein, said first and second nulling coils are substantially identical, and said second nulling current value is substantially equal to said first nulling current value.

* * * * *